(12) United States Patent
Fuergut et al.

(10) Patent No.: US 7,700,956 B2
(45) Date of Patent: Apr. 20, 2010

(54) SENSOR COMPONENT AND PANEL USED FOR THE PRODUCTION THEREOF

(75) Inventors: Edward Fuergut, Dasing (DE); Bernd Goller, Otterfing (DE); Robert-Christian Hagen, Sarching (DE); Simon Jerebic, Regensburg (DE); Jens Pohl, Bernhardswald (DE); Peter Strobel, Regensburg (DE); Holger Woerner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 70 days.

(21) Appl. No.: 10/561,819

(22) PCT Filed: Jun. 4, 2004

(86) PCT No.: PCT/DE2004/001147

§ 371 (c)(1),
(2), (4) Date: Nov. 15, 2006

(87) PCT Pub. No.: WO2005/001942

PCT Pub. Date: Jan. 6, 2005

(65) Prior Publication Data

US 2007/0128754 A1 Jun. 7, 2007

(30) Foreign Application Priority Data

Jun. 23, 2003 (DE) ................................. 103 28 265

(51) Int. Cl.
*H01L 27/15* (2006.01)

(52) U.S. Cl. ............................ 257/80; 257/81; 257/184; 257/431; 257/444; 257/E31.127

(58) Field of Classification Search ................. 257/226, 257/723, 678, E31.117, E31.127, 431–434, 257/80, 81, 184, 444
See application file for complete search history.

(56) References Cited

U.S. PATENT DOCUMENTS

| | | | |
|---|---|---|---|
| 5,200,810 A | | 4/1993 | Wojnarowski et al. |
| 5,353,498 A | * | 10/1994 | Fillion et al. ................... 29/840 |
| 5,762,853 A | | 6/1998 | Harris et al. |
| 6,001,671 A | | 12/1999 | Fjelstad |
| 6,242,282 B1 | * | 6/2001 | Fillion et al. ................. 438/106 |

(Continued)

FOREIGN PATENT DOCUMENTS

DE 10056 776 10/2001

(Continued)

OTHER PUBLICATIONS

Ray Fillion et al., "Development of a Plastic Encapsulated Multichip Technology for High Volume, Low Cost Commercial Electronics", GE Corporate Research and Development, pp. 805-809.

*Primary Examiner*—Wai-Sing Louie
(74) *Attorney, Agent, or Firm*—Dicke, Billig & Czaja, PLLC (57) ABSTRACT

A sensor component and a panel used for the production thereof is disclosed. The sensor component has, in addition to a sensor chip with a sensor region, a rear side and passive components. These are embedded jointly in a plastics composition, in such a way that their respective electrodes can be wired from an overall top side of a plastic plate.

8 Claims, 6 Drawing Sheets

U.S. PATENT DOCUMENTS

| | | |
|---|---|---|
| 6,379,998 B1 * | 4/2002 | Ohta et al. .................. 438/107 |
| 6,399,418 B1 | 6/2002 | Glenn et al. |
| 6,468,832 B1 | 10/2002 | Mostafazadeh |
| 6,630,661 B1 * | 10/2003 | Hoffman .................... 250/239 |
| 7,061,106 B2 * | 6/2006 | Yang et al. ................. 257/723 |
| 7,105,904 B2 * | 9/2006 | Choi ......................... 257/432 |
| 2003/0094675 A1 * | 5/2003 | Yamamoto et al. .......... 257/666 |

FOREIGN PATENT DOCUMENTS

| | | |
|---|---|---|
| EP | 0611129 | 2/1994 |
| EP | 0802030 | 3/1997 |
| WO | 01/17033 | 3/2001 |

* cited by examiner

SENSOR COMPONENT AND PANEL USED FOR THE PRODUCTION THEREOF

CROSS-REFERENCE TO RELATED APPLICATION

This Utility Patent Application claims the benefit of the filing date of Application No. DE 103 28 265.3, filed Jun. 23, 2003 and International Application No. PCT/DE2004/001147 filed Jun. 4, 2004, both of which are herein incorporated by reference.

FIELD OF THE INVENTION

The invention relates to a sensor component and a panel with a plurality of sensor component positions, sensor chips with sensor regions and with contact areas on their active top sides being arranged in the positions.

BACKGROUND

The sensor chips of sensor components have hitherto been arranged on a circuit substrate or on a panel in the form of a printed circuit board with a plurality of sensor component positions. An arrangement of this type necessitates producing, toward the circuit substrate or toward the panel, in each of the sensor component positions, connections from the contact areas to contact pads on the circuit substrate. These connections are created by means of time-consuming and cost-intensive, and also thermally stressing connection techniques, which restricts the reliability of the sensor component and at the same time causes high costs.

SUMMARY

The present invention provides a sensor component which has an improved reliability and can be produced more cost-effectively.

In one embodiment, the invention provides a sensor component having a sensor chip with a sensor region on its active top side. The electrodes of the sensor region are connected via conductor tracks to contact areas on the active top side of the sensor chip. The sensor chip is embedded in a plastic plate by its rear side and by its edge sides, the active top side of the sensor chip together with a top side of the plastic plate forming an overall top side. A rewiring structure with a rewiring layer is arranged on the overall top side, the rewiring lines extending from the contact areas to external contact areas of the sensor component.

A sensor component of this type has the advantage that it is not necessary to overcome level jumps for the electrical connections between sensor chip and plastic plate, rather the rewiring structure with its rewiring lines is arranged on an overall top side. Complex connection techniques, such as bonding technique or flip-chip technique, are consequently obviated. Moreover, with the sensor chip as many semiconductor chips and passive components as desired can be embedded in the plastic plate to form a sensor module. For this purpose, electrode areas of passive components embedded in the plastic plate, are provided in the overall top side. In this case, the rewiring lines on the overall top side connect electrode areas of the passive components to contact areas of the sensor chip and/or of the semiconductor chip and/or of the external contact areas.

Such wiring with the aid of rewiring lines is effected within a single rewiring layer. This rewiring layer may be extended by further insulation layers and rewiring layers, a plurality of rewiring layers being connected to one another via through contacts through the insulation layers. This results in a multilayer rewiring structure that is formed without a high outlay on to the overall top side comprising semiconductor top sides and plastic top sides.

Instead of an arrangement of sensor chip and semiconductor chip alongside one another, it is also possible to accommodate a stacking of a sensor chip with a semiconductor chip one above the other in the plastic plate. This has the advantage that the overall top side of the sensor component can be kept small.

The sensor region may react to pressure, temperature, thermal radiation or electromagnetic radiation.

In a further embodiment of the invention, a lens is arranged above the sensor region in order to achieve a higher optical sensitivity. The lens may be composed of glass or have a flat lens film with Fresnel rings, which has the advantage that the height of the sensor component is not significantly increased by fitting a Fresnel lens.

Outside the region of the sensor chip, in a further embodiment of the invention, the plastics composition may have through contacts to external contact areas which are situated opposite to the overall top side. This has the advantage that the sensor region is freely accessible, even if the sensor component is fixed on a printed circuit board with the aid of the external contacts. Otherwise, that is to say if no through contacts are provided through the plastics composition, and the external contacts are arranged on the same top side, that is to say on the common overall top side, it would be necessary to provide an opening in a printed circuit board arranged thereabove, thereby enabling access to the sensor region of the sensor chip. The through contacts to the external contact areas can be electrically connected via rewiring lines to the contact areas of the sensor chip on the overall top side.

A further aspect of the invention relates to an optoelectronic device, which has a sensor component accommodated in a camera housing. In this case, the sensor region of the semiconductor chip has a CCD structure or some other image recording structure by means of which, by way of example, images can be recorded by means of a mobile phone and can be transmitted to a call partner.

The sensor component may also have an addition, such that it can be used as an optoelectronic coupling component. In this case, an optical fiber plug-in region, in which an optical fiber as optical waveguide can be plugged in, is arranged above the sensor region. Optoelectronic coupling components of this type are required in large quantities, so that the cost-effective production of the sensor component according to the invention is advantageous.

A further aspect of the invention relates to a panel having component positions arranged in rows and columns for sensor components. In this case, the panel already has all the circuit components of the sensor component, such as sensor chip with sensor region and with contact areas, top sides of semiconductor chips with contact areas, electrodes of passive strip elements, a plastic top side surrounding the semiconductor chip top sides, a rewiring structure on an overall top side. In this case, the rewiring structure has a rewiring layer with rewiring lines which connects the contact areas of the sensor chips to external contact areas of the sensor component. On the overall top side of the panel, external contacts may also be arranged on the external contact areas in order to complete a sensor component in each of the component positions before the panel is separated into individual components.

In one embodiment, a method for the production of a panel includes the following:

Provision is made of a semiconductor wafer having sensor chip positions arranged in rows and columns. Afterward, the semiconductor wafer is separated into individual sensor chips with a sensor region and contact areas on an active top side of the sensor chips. An adhesive film or an adhesive plate is then inserted into a first mold half with component positions arranged in rows and columns. There is then applied to the component positions of the adhesive film or of the adhesive plate in each case a sensor chip of the semiconductor wafer in the component positions with adhesive bonding of the active top side of the sensor chips on to the adhesive side of the adhesive film or the adhesive plate.

The mold halves are then brought together and a plastics composition is injected into the mold with the sensor chips being embedded on one side. After the plastics composition has been cured to form a composite plate comprising plastics composition and sensor chips, the mold halves are moved apart and the composite plate is removed. Finally, the adhesive film or the adhesive plate is removed from the composite plate and a rewiring structure is applied to the freed overall top side of the composite plate.

This method has the advantage that after the injection-molding of the composite plate, a common overall top side for the application of further coatings is available simultaneously for a plurality of sensor components. Furthermore, the method has the advantage that neither a step between the active top side of the sensor chip and the plastics composition nor a distance between the active top side of the sensor chip and the plastics composition occurs, so that the entire sensor component can be wired with a single rewiring layer. This rewiring layer of the rewiring structure has rewiring lines that connect the contact areas of the sensor chip to external contact areas of the sensor component. Furthermore, external contacts in the form of solder bumps or solder balls or external contact pads can be applied to said external contact areas whilst still in the state of the panel.

In a further exemplary implementation of the method, electrodes of passive components are concomitantly applied to the adhesive film or adhesive plate, so that it is possible to realize a more complex sensor circuit for the sensor component. Furthermore it is also possible to position additional semiconductor chips with integrated circuits in the component positions, to be precise in each case with their contact areas on the adhesive film or adhesive plate, in order that when the adhesive film or adhesive plate is stripped away, the contact areas of the additionally integrated circuits can be contact-connected by rewiring lines.

Consequently, this method makes it possible to construct complex sensor components in an extremely simple manner, only one molding step being required for creating the card-type housing and only one patterned rewiring layer being required for the connection of the individual circuit components in the form of passive components and integrated circuit elements and sensor chips. If the sensor chip and a semiconductor chip with integrated circuit should be stacked one above the other, then it is necessary to carry out an internal stack wiring prior to embedding in the common plastic plate and/or an elevation of the contact areas of the lower semiconductor chip is required in order to wire them on the overall top side with other components of the sensor component.

A method for the production of a sensor component has the additional method that after the production of a panel, external contacts are also applied to the external contact areas and the panel is subsequently separated into individual sensor components.

To summarize, it can be stated that the invention produces an inexpensive, space-saving housing which additionally has a good characteristic with regard to moisture sensitivity. This is achieved by virtue of the fact that the housing is constructed on the basis of a so-called "universal package" technology. Unlike in the mounting of normal, non-optical semiconductors, in the case of the optoelectronic components, the sensor areas are not covered by dielectrics or soldering resists, but rather are left free for later covering with optical materials or optical components, for example lenses. To summarize, the following advantages are thus afforded:

1. low production costs of the housing;
2. small space requirement of the housing as is required for mobile phone cameras, for example;
3. a surface mounting of the housing is possible on account of the low moisture sensitivity, which means that the component according to the invention can be soldered on to a circuit board of a higher-level circuit in normal surface-mounting processes without any problems.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
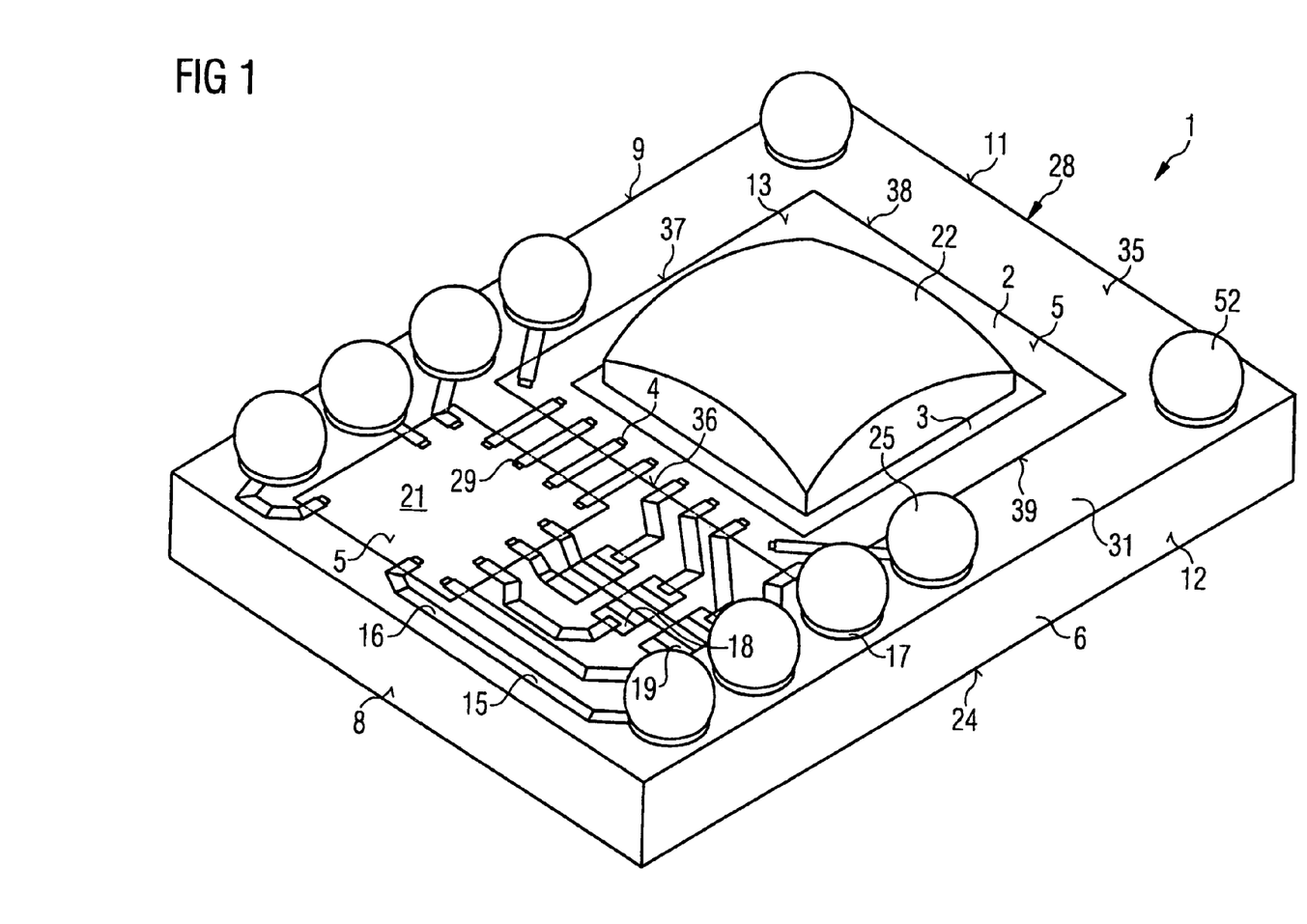
FIG. 1 illustrates a schematic perspective view of a sensor component of a first embodiment of the invention.

FIG. 1 illustrates a schematic perspective view of a sensor component 1 of a first embodiment of the invention. A sensor chip 2 is embedded by its edge sides 36, 37, 38 and 39 in a plastic plate 6 with the edge sides 8, 9, 11 and 12. An active top side 5 of the sensor chip 2 and a top side 35 of the plastic plate 6 form an overall top side 13. In addition to the active top side 5 of the sensor chip 2, the overall top side 13 comprises an active top side of an additional semiconductor chip 21, on which contact areas 29 are arranged. Furthermore, the electrode areas 18 of three passive components 19 are arranged on the overall top side 13.

Besides the contact areas 4 and 29 or of the both of the sensor chip 2 and of the semiconductor chip 21 and of the electrodes 18 of the passive components 19, the overall top side has external contact areas 17 on which external contacts 25 are arranged.

A rewiring layer 15 is arranged on the overall top side 13, which rewiring layer, with its rewiring lines 16, connects contact areas 4 of the semiconductor chip 2 to contact areas 29 of the semiconductor chip 21 and connects contact areas 4 to electrode areas 18, and, via further rewiring lines 16, connects the contact areas 4 and 29 and also the electrode areas 18 to external contact areas 17 on the overall top side 13. Consequently, the sensor component 1 shown in FIG. 1 already constitutes a sensor module and can be connected via the external contacts 25 to a higher-level circuit on a printed circuit board. In the case of such surface mounting of a sensor component of the first embodiment of the invention, as shown in FIG. 1, it is necessary to provide an opening in the higher-level circuit board, said opening corresponding to the sensor region 3 of the sensor chip 2, in order to enable access on the sensor region 3.

Figure 2:
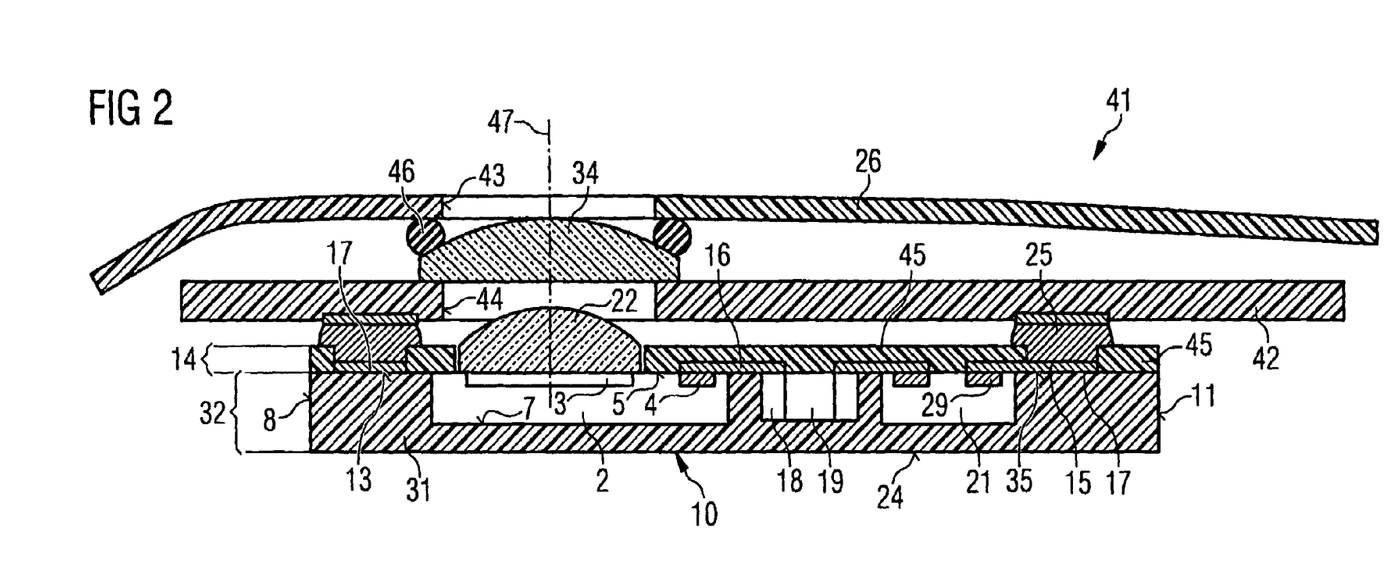
FIG. 2 illustrates a schematic cross section through a sensor component in a housing in accordance with a second embodiment of the invention.

FIG. 2 illustrates a schematic cross section through a sensor component 10 in a camera housing 26 in accordance with a second embodiment of the invention. Components having functions identical to those in FIG. 1 are identified by the same reference symbols and are not discussed separately.

The sensor component 10 is a part of a camera component 41, and is arranged on a higher-level circuit board 42 in the camera housing 26 of a mobile telephone. The three components, system component 10, circuit board 42 and camera housing 26, are arranged one above another, the sensor component 10 being arranged below the higher-level circuit board 42 and the circuit board 42 being arranged below the camera housing 26. The sensor component 10 has a sensor chip 2, a semiconductor chip 21 and passive components 19. The sensor chip 2 has an active top side 5 with a sensor region 3 and contact areas 4 and a rear side 7. The semiconductor chip 21 has contact areas 29, and the passive component 19 has electrode areas 18.

The sensor chip 2, the semiconductor chip 21 and the passive components 19 are embedded in a plastic composition 31 in such a way that they form a plastic plate 6 having an overall top side 13 with the sensor region 3, the contact areas 4 and 29 and the electrode areas 18. Rewiring lines 16 which interconnect the circuit elements 2, 19 and 21 and produce electrical connections to external contact areas 17 are arranged on said overall top side 13. External contacts 25 which are soldered to the higher-level circuit board 42 are arranged on the external contact areas 17.

The rewiring lines 16 form a rewiring layer 15, which is part of a rewiring structure 14, the rewiring structure 14 additionally having an insulating covering layer 45, which leaves only the sensor region 3 and the external contact areas 17. The sensor region 3 bears a lens 22 oriented with respect to the optical axis 47 of a second lens 34, the second lens 34 being oriented between camera housing 26 and higher-level circuit board 42.

The higher-level circuit board 42 and the camera housing 26 have openings 43 and 44, the side of which corresponds to the sensor region 3 of the sensor chip 2, so that the optical impression of the surroundings can act on the sensor region 3 of the sensor chip 2 via the lenses 34 and 22. A sealing element 46 between the second lens 34 and the camera housing 26 ensures that no moisture and no dust particles can penetrate into the housing 26.

Figure 3:
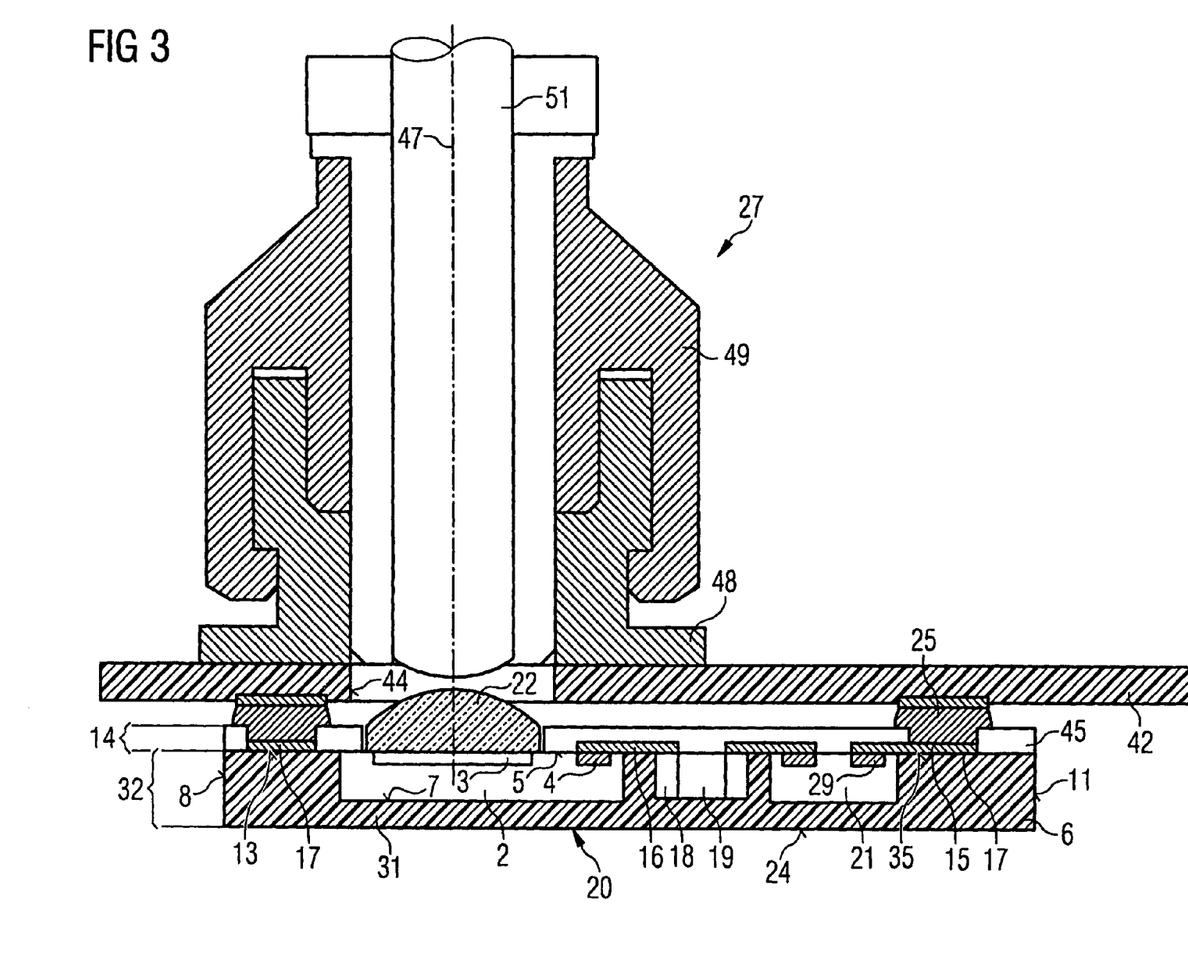
FIG. 3 illustrates a schematic cross section through a sensor component as coupling component in accordance with a third embodiment of the invention.

FIG. 3 illustrates a schematic cross section through a sensor component 20, designed as a coupling component in accordance with a third embodiment of the invention. Components having functions identical to those in the previous figures are identified by the same reference symbols and are not discussed separately.

The sensor component 20 has a similar construction to the sensor component 10 in FIG. 2, but the lens 22 is oriented to an optical fiber 51. Instead of the camera housing 26 as in FIG. 2, an optical fiber plug-in region 27 with an optical fiber plug-in base 48 is arranged above the opening 44 in the higher-level circuit board 42 and fixed on the higher-level circuit board 42. The optical fiber plug-in base 48 is structured in such a way that a plug-in sleeve 49 which is fixed on the optical fiber 51 can be brought into engagement with the optical fiber plug-in base 48. The optical fiber plug-in base 48 is oriented in such a way that the optical axes 47 of the optical fiber 51 and the lens 22 are oriented with respect to one another.

Figure 4:
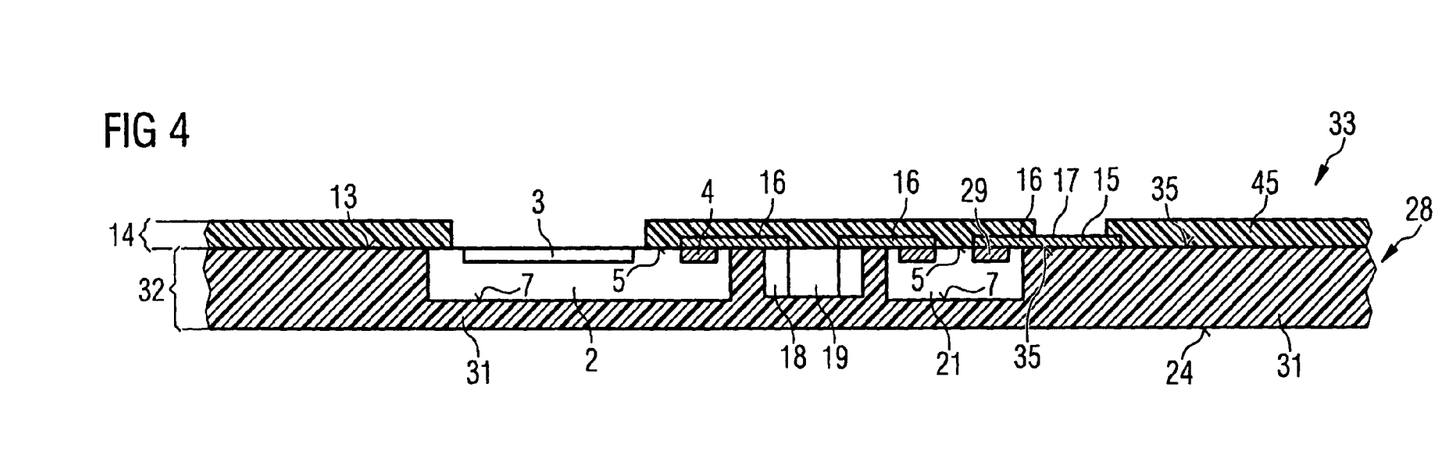
FIG. 4 illustrates a schematic cross section through a sensor component position of a panel prior to the application of external contacts.

FIG. 4 illustrates a schematic cross section through a sensor component position 33 of a panel 28 prior to the application of external contacts and prior to the separation of the panel 28 into individual sensor components. Components having functions identical to those in the previous figures are identified by the same reference symbols and are not discussed separately.

The panel 28 has a composite plate 32 with a plastic plate rear side 24. The composite plate 32 comprises a plastics composition 31 and sensor chips 2, semiconductor chips 21 and passive components 19 embedded therein. The circuit components 2, 19 and 21 are embedded in the plastics composition 31 of the composite plate 32 in such a way that they form an overall top side 13 which is covered with a rewiring structure 14 comprising a rewiring layer 15 with rewiring lines 16. An insulating covering 45 then leaves free only the sensor regions 3 and the external contact areas 17 in each of the component positions 33 of the panel 28.

Figure 5:
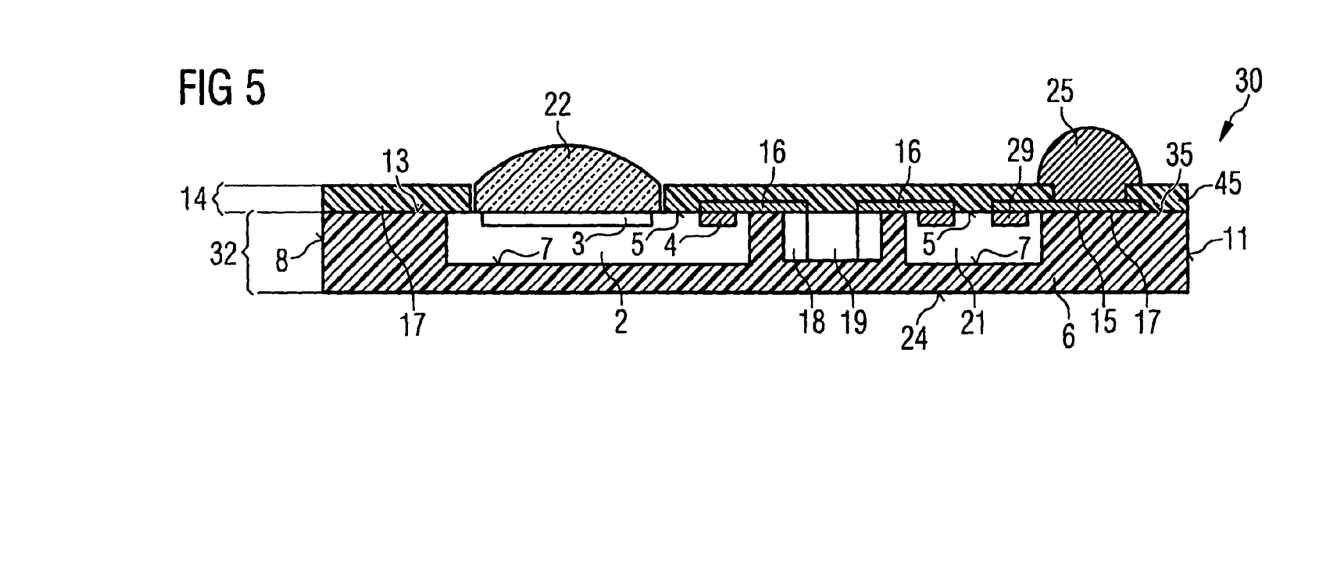
FIG. 5 illustrates a schematic cross section through a sensor component after application of a lens to a sensor region of the component as fourth embodiment of the invention.

FIG. 5 illustrates a schematic cross section through a sensor component 30 after application of a lens 22 to a sensor region 3 of the sensor component 30 according to a fourth embodiment of the invention. The lens 22 and the external contacts 25 for each of the sensor components 30 may either already be applied to the panel shown in FIG. 4 in each of the component positions or be subsequently fixed on each individual sensor component 30. The fourth embodiment of the invention as shown in FIG. 5 exclusively has external contacts 25 on external contact areas 17 which are connected via rewiring lines 16 to corresponding electrodes of the embedded circuit components of the sensor component 30.

Figure 6:
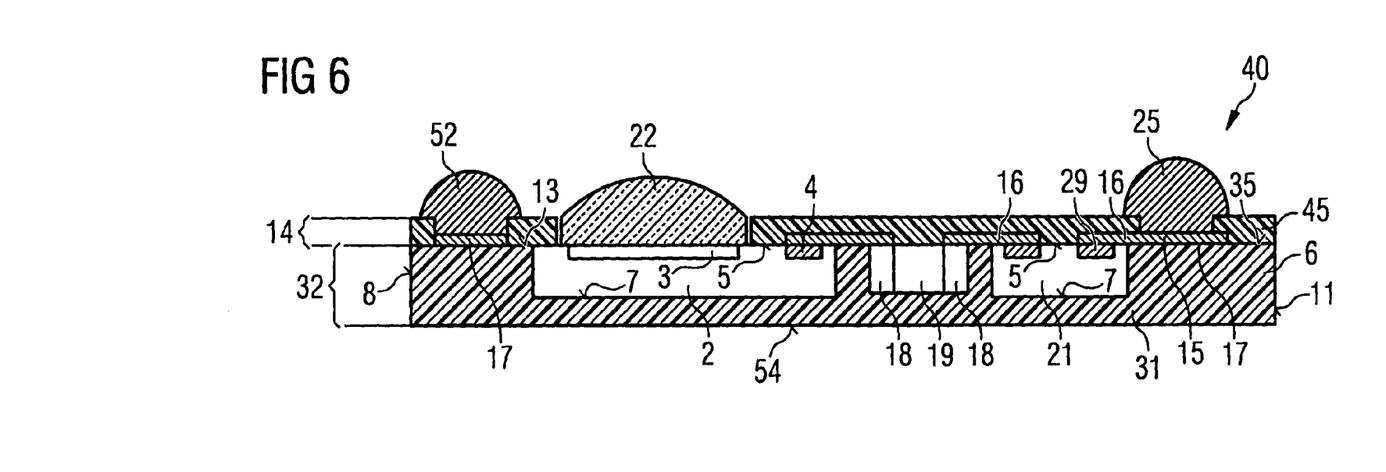
FIG. 6 illustrates a schematic cross section through a sensor component in accordance with a fifth embodiment of the invention.

FIG. 6 illustrates a schematic cross section through a sensor component 40 of a fifth embodiment of the invention. Components having functions identical to those in the previous figures are identified by the same reference symbols and are not discussed separately.

The fifth embodiment of the invention in accordance with FIG. 6 differs from the fourth embodiment in accordance with FIG. 5 by virtue of the fact that in addition to external contacts 25 which are connected via rewiring lines 16 to the electrode areas 19 and contact areas 4 and 29 of the circuit components 2, 18 and 21 of the sensor component, distance-maintaining external contacts 52 are arranged on the overall top side. The external contacts 52 ensure, in the course of soldering the sensor component 40 on to a higher-level circuit board, that a sufficient distance between the lens 22 and the circuit board arranged thereabove is complied with. In the fifth embodiment of the invention, too, the circuit components such as sensor chip 2, semiconductor chip 21 and passive components 19 are arranged in such a way that each of the components can be contact-connected by its electrodes from the overall top side 13.

Figure 7:
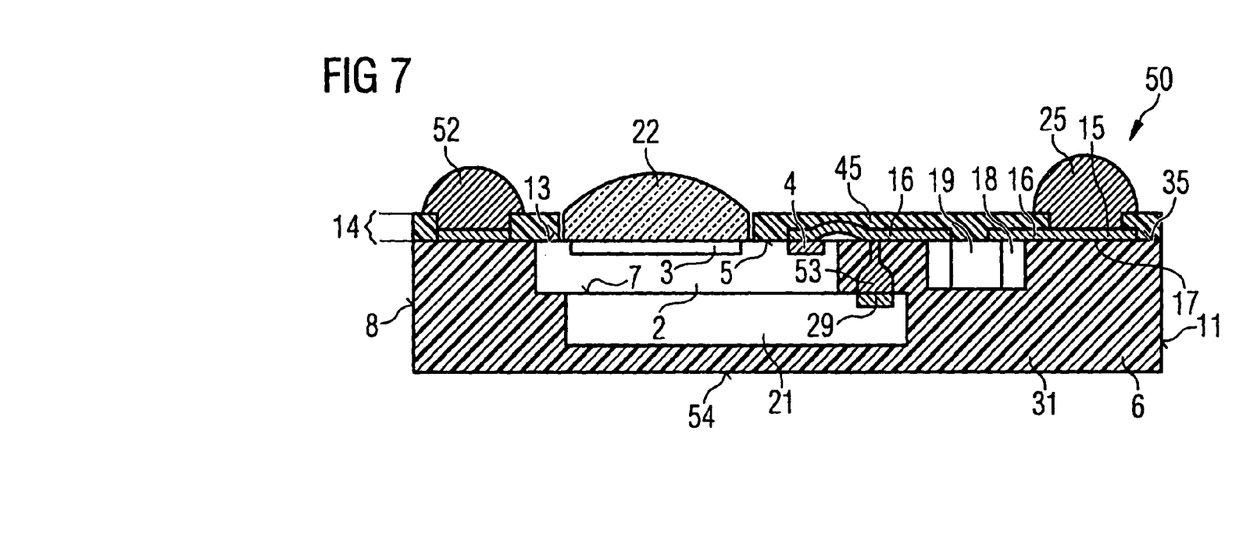
FIG. 7 illustrates a schematic cross section through a sensor component in accordance with a sixth embodiment of the invention.

FIG. 7 illustrates a schematic cross section through a sensor component 50 of a sixth embodiment of the invention. This sixth embodiment of the invention differs from the previous embodiments by virtue of the fact that the semiconductor chip 21 and the sensor chip 2 are stacked one on top of the other prior to embedding in the plastics composition 31. In the course of stacking, care is taken to ensure that the contact areas 29 are not covered by the sensor chip 2, rather that the contact areas 29 can be occupied by thermocompression heads 53, the height of which corresponds to the thickness of the sensor chip 2. Consequently, the semiconductor chip 21 arranged below the sensor chip 2 can also be connected to the remaining components of the sensor component 50 via the overall top side 13 and the rewiring layer 15 arranged there.

Figure 8:
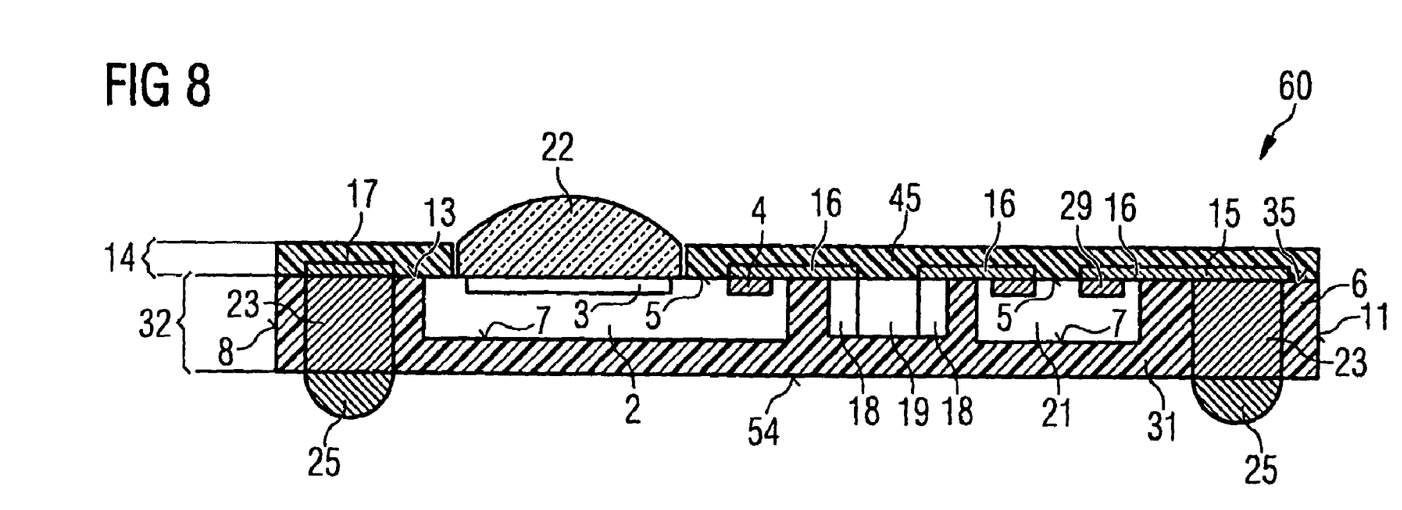
FIG. 8 illustrates a schematic cross section through a sensor component in accordance with a seventh embodiment of the invention.

FIG. 8 illustrates a schematic cross section through a sensor component 60 in accordance with a seventh embodiment of the invention. The seventh embodiment of the invention in accordance with FIG. 8 differs from the previous embodiments by virtue of the fact that through contacts 23 are provided through the plastics composition 31, the length of said through contacts corresponding to the thickness of the plastic plate 6. It is thus possible to fit external contacts 25 on the rear side 54 of the sensor component 60, which external contacts are then arranged in a manner situated opposite to the lens 22 or to the sensor region 3 of the sensor chip 2. With this seventh embodiment of the invention it is possible to realize surface mounting on a higher-level circuit board, an opening in the higher-level printed circuit board not being required since the sensor region 3 of the sensor component 60 is freely accessible despite surface mounting on a higher-level circuit board.

The invention claimed is:

1. A sensor component comprising:
a sensor chip with a sensor region, conductor tracks and contact areas on an active top side of the sensor chip;
a plastic plate, in which the sensor chip is embedded by its rear side and its edge sides, the active top side of the sensor chip and top sides of the contact areas, together with a top side of the plastic plate having a planar overall top side; and
a rewiring structure with a rewiring layer having flat rewiring lines from the contact areas to external contact areas of the sensor components, the rewiring structure being arranged on the planar overall top side.

2. The sensor component of claim 1, comprising:
wherein the overall top side comprises electrode areas of passive components embedded in the plastic plate, rewiring lines extending from the electrode areas to contact areas and/or to external contact areas.

3. The sensor component of claim 2, comprising:
wherein the overall top side comprises contact areas of a semiconductor chip with integrated circuit, rewiring lines extending from the contact areas of the semiconductor chip to contact areas of the sensor chip and/or to electrode areas and/or to external contact areas.

4. The sensor component of claim 1, comprising wherein the sensor chip and a semiconductor chip with integrated circuit are embedded in a manner stacked one above the other in the plastic plate, the sensor region forming a part of the overall top side.

5. The sensor component of claim 1, comprising wherein the sensor region is radiation-sensitive and comprises a lens.

6. The sensor component of claim 1, comprising wherein the plastic plate comprises through contacts, the through contacts being connected to external contact areas on a plastic plate rear side and being electrically connected to the rewiring lines on the overall top side.

7. A sensor component comprising:
a sensor chip with a sensor region, conductor tracks and contact areas on an active top side of the sensor chip;
a plastic plate, in which the sensor chip is embedded by its rear side and its edge sides, the active top side of the sensor chip and top sides of the contact areas, together with a top side of the plastic plate having a planar overall top side; and
means for connecting the contact areas to the external contact areas of the sensor components.

8. The sensor component of claim 7, comprising:
wherein the overall top side comprises electrode areas of passive components embedded in the plastic plate, rewiring lines extending from the electrode areas to contact areas and/or to external contact areas.

* * * * *